(12) United States Patent  
Feeley et al.

(10) Patent No.: US 8,468,400 B2  
(45) Date of Patent: *Jun. 18, 2013

(54) METHOD FOR DETECTING FLASH PROGRAM FAILURES

(75) Inventors: Peter S. Feeley, Boise, ID (US); Wanmo Wong, Menlo Park, CA (US); Theodore T. Pekny, Sunnyvale, CA (US); Samuel A. Shapero, Atlanta, GA (US); Brady Keays, Half Moon Bay, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/589,861

(22) Filed: Aug. 20, 2012

(65) Prior Publication Data

US 2012/0314498 A1    Dec. 13, 2012

Related U.S. Application Data

(63) Continuation of application No. 12/353,878, filed on Jan. 14, 2009, now Pat. No. 8,250,417.

(51) Int. Cl.
*G01R 31/28* (2006.01)
*G11C 29/00* (2006.01)
*G06F 11/00* (2006.01)

(52) U.S. Cl.
USPC .......................................... 714/718; 714/736

(58) Field of Classification Search
USPC ..... 714/718, 736, 746, 777, 704; 365/185.33, 365/201, 185.18, 185.09, 185.22
See application file for complete search history.

(56) References Cited

U.S. PATENT DOCUMENTS

| 3,562,661 | A  | * | 2/1971  | Crumb et al. ................. 331/10 |
| 4,228,513 | A  |   | 10/1980 | Doljack |
| 5,535,067 | A  | * | 7/1996  | Rooke ............................. 360/51 |
| 6,144,627 | A  |   | 11/2000 | Muto |
| 6,304,517 | B1 |   | 10/2001 | Iedfelt et al. |
| 6,606,589 | B1 |   | 8/2003  | Tuma et al. |
| 6,687,198 | B2 |   | 2/2004  | Yamawaki |
| 7,157,948 | B2 | * | 1/2007  | McClannahan et al. ...... 327/151 |
| 7,478,270 | B2 |   | 1/2009  | Kurita et al. |
| 7,573,754 | B2 |   | 8/2009  | Kim et al. |
| 7,843,732 | B2 |   | 11/2010 | Lee et al. |
| 8,082,476 | B2 |   | 12/2011 | Kurjanowicz |

(Continued)

FOREIGN PATENT DOCUMENTS

GB          2276744       10/1994

*Primary Examiner* — Phung M Chung
(74) *Attorney, Agent, or Firm* — Fletcher Yoder (57) ABSTRACT

One or more techniques are provided for programming a flash memory device. In one embodiment, the memory device is programmed such that a data pattern written to a page in the memory device has encoded therein an expected count value corresponding to the number of times a first binary value occurs in the data pattern. The data pattern includes the program data and the expected count value, and is written to the page in a single operation. The expected count value may be stored in a count field in the management area of the page. During a page read operation, the expected count value is compared to the actual count of the number of bits having the first binary value in the data area of the page. If the expected count is equal to the actual count, then the program data is determined to be valid.

32 Claims, 7 Drawing Sheets

U.S. PATENT DOCUMENTS

| | | |
|---|---|---|
| 8,107,182 B2 | 1/2012 | Yen |
| 8,120,990 B2 * | 2/2012 | Kim .......................... 365/238.5 |
| 2010/0149881 A1 * | 6/2010 | Lee et al. ................. 365/185.33 |
| 2012/0113721 A1 * | 5/2012 | Kim .......................... 365/185.12 |

* cited by examiner

METHOD FOR DETECTING FLASH PROGRAM FAILURES

CROSS-REFERENCE TO RELATED APPLICATION

This application is a continuation of U.S. patent application Ser. No. 12/353,878, which was filed on Jan. 14, 2009, now U.S. Pat. No. 8,250,417, which issued on Aug. 21, 2012.

BACKGROUND

1. Field of the Invention

Embodiments of the invention relate generally to the field of memory devices and, more particularly, to techniques for detecting programming failures in flash memory devices.

2. Description of the Related Art

In recent years, NAND flash memory has become an increasingly popular form of non-volatile storage utilized by various embedded systems and electronic devices, such as portable digital media players, memory cards, USB flash drives, and cellular telephones, to name a few. The increased demand may be attributed, at least partially, to the higher memory densities that NAND flash memory devices typically offer relative to other types of non-volatile memories, such as NOR flash memory. Additionally, NAND flash memory may generally be produced at a lower cost relative to NOR flash memory due, for instance, to the lower number of metal contacts utilized in constructing a NAND flash memory array. Thus, as the demand for lower-power, lighter, and more robust memory-based products continues to increase, NAND flash memory continues to provide an attractive solution for a wide range of applications.

Despite the above-mentioned advantages, NAND flash memory has some drawbacks. For instance, NAND flash memory devices may sometimes include bad blocks due, for example, to defects that may have occurred during the manufacturing process, and may require error correction to maintain data integrity. Additionally, flash memory devices may be susceptible to programming failures that may occur during operation. As will be understood, the failure to successfully program a memory device will result in some memory cells failing to reach their expected programmed state. By way of example, such programming failures may occur as a result of a power interruption during a programming operation.

To counter this particular type of programming failure, many flash memory devices utilize a flash management algorithm for detecting and ignoring memory pages that were unsuccessfully programmed when power is eventually restored to the NAND flash memory device. Conventional flash management algorithms have typically been configured to detect unsuccessfully programmed pages by performing a program operation to a management area for each logical block of data written to a data area of a page within a flash memory array. For example, the program operation performed by the flash management algorithm may include storing some type of indicator (e.g., setting a bit, semaphore, etc.) in the management area that indicates the validity of each logical block in the data area of the programmed page.

Thus, while conventional flash memory algorithms are capable of detecting flash programming failures, two separate programming operations are generally utilized in order to do so. Specifically, a first write operation is used to write a data pattern to a page of the flash memory array, and a second write operation is used to store the indication (e.g., in the management area) as to whether or not the page was successfully programmed. As will be understood, the two programming operations utilized to indicate the validity of data in a memory page may undesirably increase the total time required to program a memory array.

Accordingly, embodiments of the present invention may be directed to one or more of the problems set forth above.

DETAILED DESCRIPTION OF SPECIFIC EMBODIMENTS

As discussed in further detail below, one or more embodiments of the present invention provide one or more techniques for the detection of NAND flash programming failures using a single programming operation. One such technique exploits a fundamental principle relating to how flash memory is programmed. Generally, a NAND flash programming operation begins with a fully erased page. Typically, this is accomplished by initiating an erase operation which results in a charge being "erased" from each of the memory cells of the page. In the context of NAND flash memory, an erase operation may include writing the same data value to each of the memory cells in a page. The data value may be a binary logic value, such as a 0 or 1. By way of example, in one embodiment, an erase operation may be viewed as storing a value of "1" for a single level cell (SLC) memory, or a value of "11" for a multiple level cell (MLC), in each of the cells in a page. The programming algorithm then writes a desired data pattern to the target page by selectively changing the state of the charge in certain memory cells. For instance, an erased cell storing a charge corresponding to a binary value of 1 may be programmed to store a charge corresponding to a binary value of 0. The programming algorithm automatically verifies that the correct cells have changed and reports the result in a status register.

As mentioned above, a power failure during the programming operation may result in the failed or incomplete programming of certain pages of a memory array, thus leaving some memory cells in an incorrect state. In a NAND flash memory device, this type of failure may result in certain memory cells storing a binary value of 1 when a binary value of 0 is expected. In other words, when a binary value of 0 is read from a cell, it is known that it was intended to be a binary 0 and that the cell was successfully programmed. However, when a binary value of 1 is read from a cell, it may indicate two possibilities: (1) that the binary 1 was the intended value or (2) that a binary value of 0 was intended but the program operation failed to successfully complete (e.g., due to a power interruption).

The presently disclosed techniques provide a flash management algorithm capable of quickly determining whether a page in a NAND memory array was successfully programmed. One such technique includes reserving a "count field" in the management area of each page of a NAND flash memory array for storing an expected count value corresponding to the number of occurrences of a particular data value (e.g., binary 1's or 0's) expected (e.g., intended) to be in the successfully programmed page. The count may be generated using either software or hardware techniques, and may be encoded into a particular data pattern that is to be written to a target page. Thus, when the page is read, the number of binary 1's (or 0's), for example, will be counted by a page read operation and compared against the expected value read from the count field. If the actual count matches the value read from the count field, it is known that the page was programmed successfully. Accordingly, such as technique may be utilized to determine the validity of programmed data in a flash memory device by writing the data and an expected count value to a target page in a single programming operation. These and other features, aspects, and advantages will be discussed in further detail with regard to the following description of various embodiments of the present invention.

Figure 1:
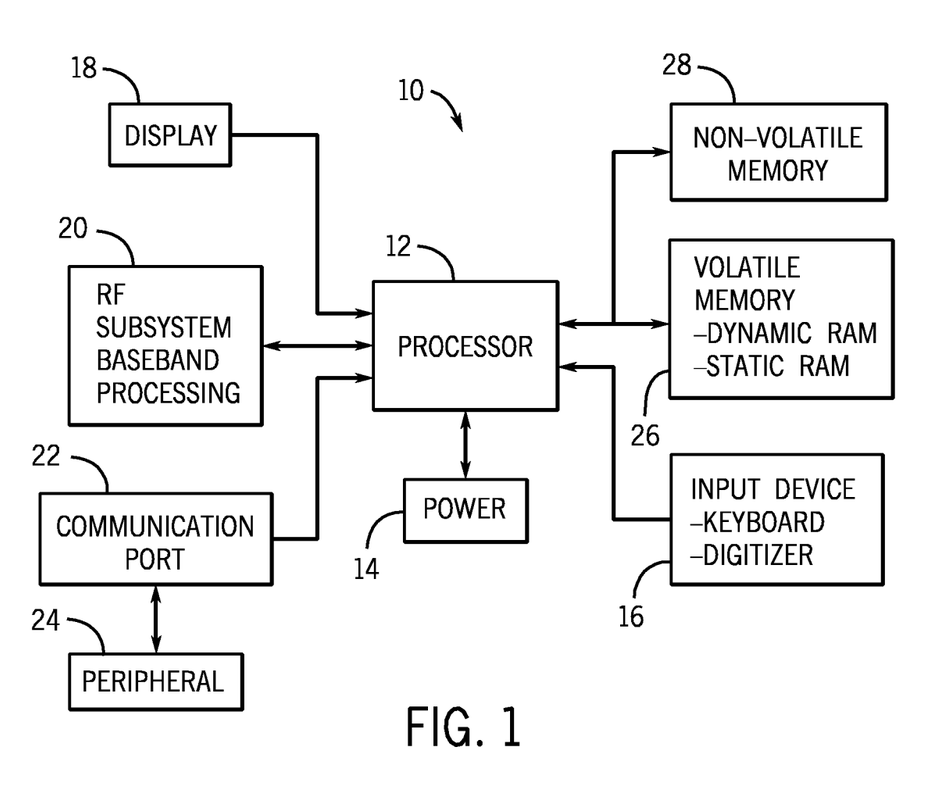
FIG. 1 is a block diagram illustrating a processor-based device which may incorporate embodiments of the present invention.

Turning now to the drawings and referring initially to FIG. 1, a block diagram depicting a processor-based device, generally designated by the reference numeral 10, is illustrated. The device 10 may incorporate embodiments of the present invention, which will be explained in further detail below. The device 10 may be any of a variety of different types, such as a computer, portable media player, cellular telephone, pager, personal organizer, control circuit, or the like. In a typical processor-based device, a processor 12 may be used to control various functions of the device 10. The processor 12 may include a single processor or, in other embodiments, it may include a plurality of processors. In a typical processor-based device, a processor 12, such as a microprocessor, may be used to control various functions of the device 10.

The device 10 typically includes a power supply 14. For instance, if the device 10 is portable, the power supply 14 may advantageously include one or more rechargeable and/or replaceable batteries. The power supply 14 may also include an A/C adapter so that the device may be plugged into a wall outlet. The power supply 14, in some embodiments, may further include a D/C adapter, so that the device 10 may be plugged into a vehicle's lighter port, for instance.

Various other devices may be coupled to the processor 12, depending upon the functions that the device 10 is configured to perform. For instance, a user interface 16 may be coupled to the processor 12. The user interface 16 may include one or more input devices, such as buttons, switches, a keyboard, a light pen, a mouse, and/or a voice recognition system, for instance. A display 18 may also be coupled to the processor 12. The display 18 may include a liquid crystal display (LCD), a light emitting diode (LED) based display, an organic light emitting diode (OLED) based display, or some other suitable display. Further, in one embodiment, the display 18 may include touch-screen capabilities allowing the display 18 to dually-operate as the user interface 16 by responding to physical contact by a user (e.g., finger, stylus, etc.).

An RF subsystem/baseband processor 20 may also be coupled to the processor 12 to communicate with other devices through a wireless link. The RF subsystem/baseband processor 20 may include an antenna that is coupled to an RF receiver and to an RF transmitter (not shown in FIG. 1). Also, a communication port 22 may also be coupled to the processor 12 for additional communication with other devices. The communication port 22 may be adapted to be coupled to a peripheral device 24, such as a modem, a printer, or a computer, for instance, or to a network, such as a local area network (LAN), personal area network (PAN) (e.g., Bluetooth, Ultra-Wideband, etc.), or the Internet.

Because the functions of the device 10 are generally under the control of software programming executable by the processor 12, memory is coupled to the processor 12 to store and facilitate execution of one or more software programs. For instance, the processor 12 may be coupled to volatile memory 26, which may include dynamic random access memory (DRAM), static random access memory (SRAM), Double Data Rate (DDR) memory, etc. The volatile memory 26 is generally configured for storing dynamically loaded applications and, therefore, may be quite large. Additionally, the non-volatile memory 28 may include a high capacity memory, such as a disk drive, tape drive memory, CD-ROM drive, DVD-ROM drive, a CD or DVD writeable/rewritable (CD-RW, DVD-RW) drive, and/or a floppy disk drive.

The processor 12 may also be coupled to non-volatile memory 28 which, in a presently contemplated embodiment, may include a NAND flash memory device. In certain embodiments, the size of the non-volatile memory 28 may be selected to be just large enough to store necessary operating system code, firmware, application programs, and fixed data. In further embodiments, the non-volatile memory 28 may additionally include a read only memory (ROM), such as an EPROM, EEPROM, or other types of flash memory (e.g., NOR) to be used in conjunction with the volatile memory 26. Thus, while it should be understood that the non-volatile memory 28 may include a number of non-volatile memory devices, for the purposes of the present discussion, the non-volatile memory 28 shall be referred to as a NAND flash memory device which may incorporate one or more of the flash management techniques discussed herein.

As mentioned above, NAND flash memory devices may be susceptible to programming failures due to power interruptions. For instance, if the power source 14 fails or is disconnected or otherwise removed from the device 10 during a programming operation, certain memory cells within the NAND flash memory 28 may fail to reach their final expected programmed state (e.g., a binary 0 or 1). Programming failures may occur if the NAND flash memory 28 is removed from the electronic device 10 (e.g., prematurely removing a flash card from an interface on the device 10). As will be described further below, the present techniques provide a flash management system for validating data which may be performed using a single programming (e.g., write) operation, for example.

Figure 2:
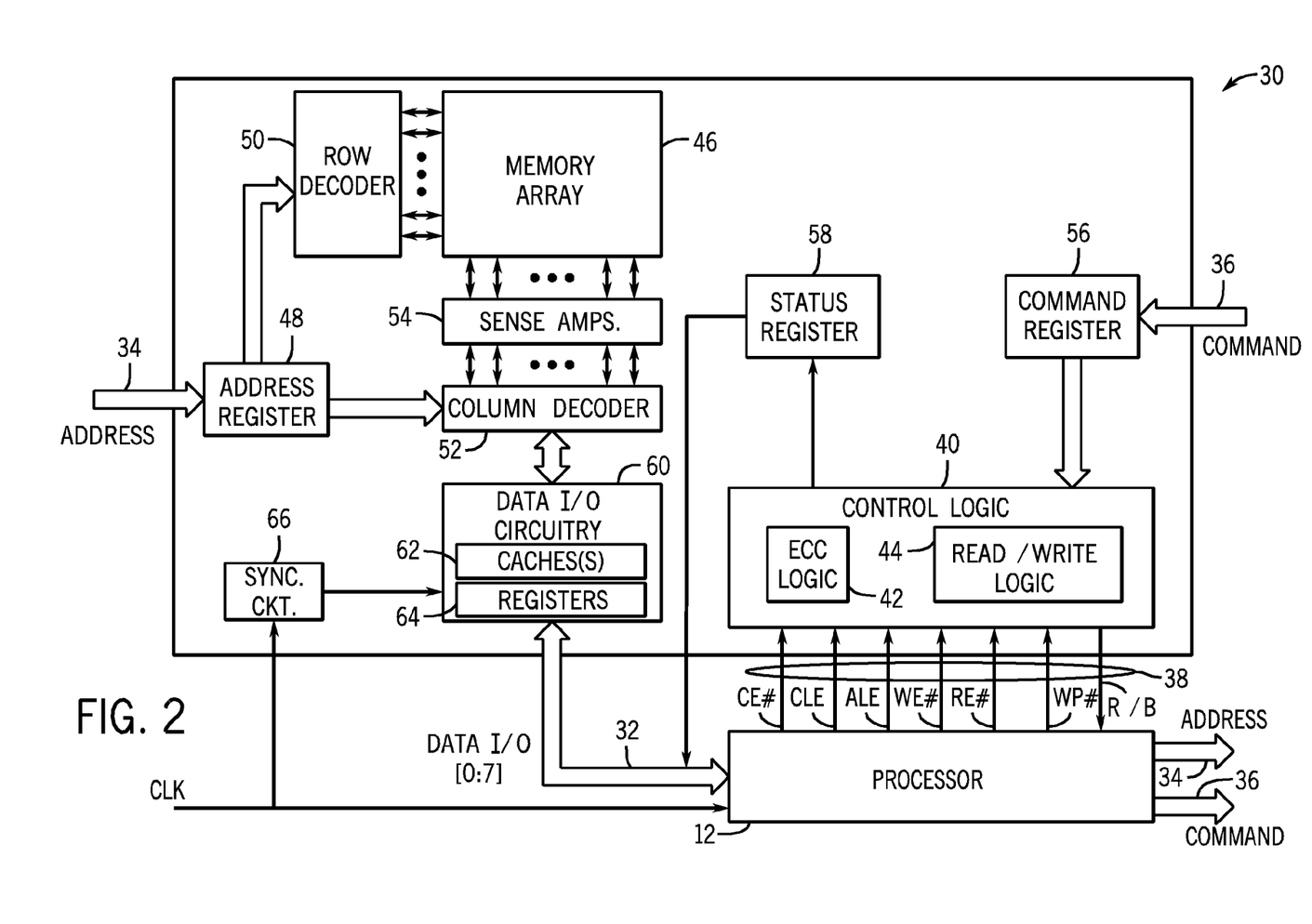
FIG. 2 is a block diagram illustrating a non-volatile NAND flash memory device that may be used in the processor-based device of FIG. 1, in accordance with an embodiment of the present invention.

Referring now to FIG. 2, a block diagram depicting an embodiment of a NAND flash memory device which may implement embodiments of the present invention is illustrated. The description of the NAND flash memory device, generally referred to by the reference number 30, has been simplified for illustrative purposes in order to facilitate a basic understanding of the features of the NAND flash memory device 30 and is not intended to be a complete description of all features that may be present in an actual implementation.

The NAND flash memory device 30 may receive control, address, command, and data information on respective busses represented by individual inputs to the NAND flash memory device 30. In some embodiments, these inputs may be multiplexed and provided using a single input bus. However, for clarity and illustrative purposes, the aforementioned inputs are represented separately in the present figure by a data bus 32, address bus 34, command bus 36, and various discrete lines representing a NAND flash interface 38 coupled to the control logic 40. The NAND flash memory device 30 also includes a NAND flash memory array 46, which may include a plurality of memory cells provided as NAND transistors arranged in banks of rows and columns. In one embodiment, the NAND transistors may include floating gate transistors. Further, other memory cells, such as those based on charge trapping or phase changing technologies, and other architectures, such as NOR and AND, could be utilized as well. As will be appreciated by those skilled in the art, each memory cell in a row may be coupled to a word line, and each memory cell in a column may be coupled to a bit line.

The NAND flash memory device 30 may interface with the processor 12 by way of the data bus 32, the address bus 34, and the command bus 36. Such a processor 12 may be a general purpose processor, a special purpose processor, an application-specific processor (e.g., ASIC), a microcontroller, a chip set, or other electronic system and/or device, for example. The processor 12 may provide a number of control signals to the NAND flash memory device 30 using the NAND flash interface 38. In the illustrated embodiment, the control signals may include the following input signals: a chip enable signal (CE#), a command latch enable signal (CLE), an address latch enable signal (ALE), a write enable signal (WE#), a read enable signal (RE#), and a write-protect signal (WP#). The signals 38 may also include an output signal labeled as the ready/busy (R/B) signal. The R/B signal may represent an active low output for indicating when the memory device 30 is processing a programming or erase operation, for instance. When such operations are completed, the R/B signal may return to a logical high state.

The control logic 40, based on the control signals discussed above, may be configured to control many available functions of the NAND flash memory device 30, including programming, read, and erase operations represented herein by the read/write logic 44. The read/write logic 44 may include a routine for counting the number of occurrences of a first binary value (e.g., 0 or 1) in a page of the memory array, and comparing the counted occurrences with an expected count value encoded within the data pattern stored on the page in order to determine the validity of the program data within the page. Further, the control logic 40 may include error correction code (ECC) logic 42 for performing detection and correction of data errors within the memory array 46. In addition, various other control circuits and signals not detailed herein may contribute to the operation of the NAND flash memory device 30, as can be appreciated by those of ordinary skill in the art. As will be explained further below, the actual count of the number of occurrences of the first binary value may be based upon a physical count (e.g., the total number of times the binary value physically occurs in the page) or may be based upon a reduced count, such as a modulo count. Similarly, the expected count value may be determined in a similar manner based upon either a physical expected count or a reduced expected count (e.g., modulo count).

To access the memory array 46, an address register 48 may receive memory address signals using the address bus 34. A row decoder 50 may receive and decode row addresses from address values received by the address register 48. The row decoder 50 typically includes a word line driver, an address decoder tree, and circuitry which translates a given row address received on the address bus 34 and selectively activates an appropriate word line or word lines by way of the word line drivers.

The NAND flash memory device 30 may also include a column decoder 52 for receiving and decoding column address signals provided to the address register 48. In some implementations, the column decoder 52 may also determine when a column within the memory array 46 is defective, as well as the address of a replacement column. The column decoder 52 is coupled to sense amplifiers 54, each of which may be coupled to complementary pairs of bit lines of the memory array 46.

Program and read operations to the memory array 46 may be determined based on commands received on the command bus 36. A command register 56 may store incoming commands received on the command bus 36 which are then executed by the control logic 40, which includes the above-discussed read/write logic 44. As will be appreciated, the execution of commands received on the command bus 36 may be based upon the state of the control signals 38 provided by the processor 12.

The status of the NAND flash memory device 30 may be monitored by values written to the status register 58. For example, if the NAND flash memory device is busy (e.g., R/B signal is low), a read status command may be issued to report the state of the status register 58. For instance, depending on the particular command being executed, certain bits within the status register 58 may be set to provide an indication of command execution results. By way of example, the status register 58 may report the state of the write-protect signal (WP#), as well as the pass or fail status of previous programming or erase operations. In accordance with one or more embodiments, the status register 58, following a page read command, may also report whether a target page was successfully programmed based on a comparison between the number of occurrences of a first value (e.g., binary 0 or 1) counted in the data area of the page and an expected count value stored within the page corresponding to the expected number of occurrences of the first value in the page.

The NAND flash memory device 30 also includes the data input/output (I/O) circuitry 60 which may include various data drivers and latches configured to provide input and output data on the data bus 32 of the device 30. The data I/O circuitry 60 may also include one or more buffers for delaying, regenerating, and storing data signals communicated between the processor 12 and the NAND flash memory device 30. For instance, during a write operation, the data bus 32 provides data to the data I/O circuitry 60. The sense amplifiers 54 receive the data from the data I/O circuitry 60 and store the data to corresponding cells or pages in the memory array 46. In some embodiments, the data bus 32 may include an 8-bit or 16-bit data bus. The data I/O circuitry 60 may also include various caches 62 and registers 64 which may serve as page buffers for reading data from and writing data to the memory array 46.

During a read operation, the NAND flash memory device 30 transfers data to the processor 12 from the memory array 46 via the data bus 32. For example, complementary bit lines for the accessed cell or cells are equilibrated during a pre-charge operation to a reference voltage provided by an equilibration circuit (not shown) and a reference voltage supply. The charge stored in the accessed cell is then shared with the corresponding bit lines. The sense amplifiers 54 then detect and amplify a difference in voltage between the complementary bit lines. The address information received on the address bus 34 is used to select a subset of the bit lines, which is then coupled to complementary pairs of input/output (I/O) lines.

The I/O lines pass the amplified voltage signals to the data I/O circuitry 60 and eventually out to the data bus 32 to be transmitted to the processor 12. Further, as will be appreciated, the output of the data may be controlled at least partially by a synchronization circuit 66 using a system clock signal CLK. By way of example, the synchronization circuit 66 may be provided as a delay lock loop circuit. The synchronization circuit 66 may be configured to provide a shifted clock signal which may be synchronous with an external system clock signal CLK, thus allowing the data I/O circuitry 60 to lock output data on the data bus 32 with the system clock CLK.

Figure 3:
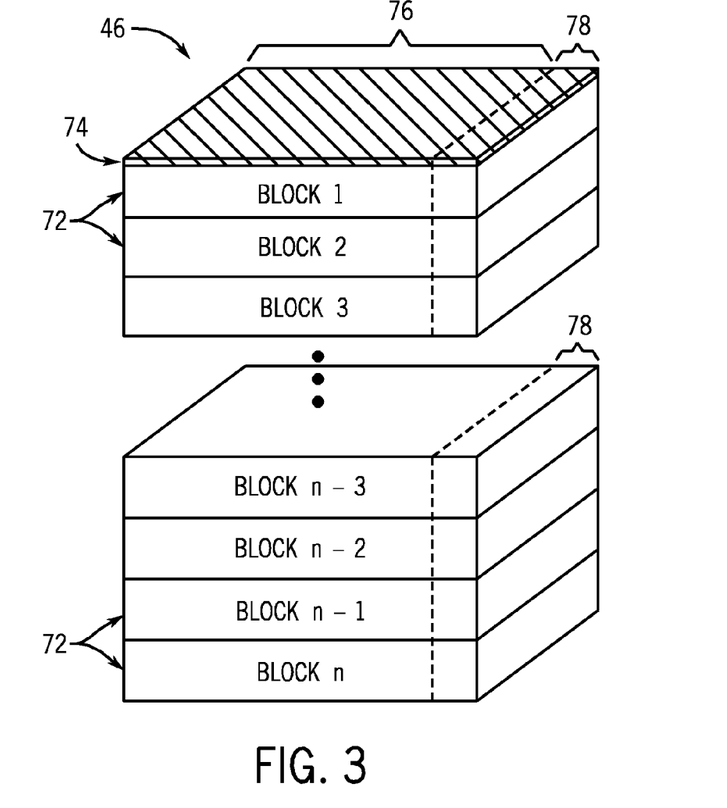
FIG. 3 is a schematic representation of a memory array that may be used in the NAND flash memory device of FIG. 2, in accordance with an embodiment of the present invention.

Continuing now to FIG. 3, a simplified schematic representation of the NAND memory array 46 of FIG. 2 is depicted, in accordance with an embodiment of the present invention. The memory array 46 may be partitioned into a plurality of blocks, such as the blocks labeled as Block 1, Block 2, . . . Block n, each of which are referred to by the reference number 72. Each block 72 may be further divided into a plurality of pages 74, each of which includes a data area 76 for storing program data, as well as a management area 78 (which is sometimes also referred to as a "spare area") for storing additional data relating to error correction, wear-leveling, as well as an expected count value for a particular data value, such as a binary 0 or 1, that is expected to be present in the program data written to the data area 76 of the page. By way of example, the expected count value may represent an expected number of occurrences of a binary value of 0 in a fully programmed page. Thus, a page read operation performed using the read/write logic 44 discussed in FIG. 2 may compare a count of binary 0 values in the data area 76 of a page 74 with a corresponding expected count for binary 0 values stored in the management area 78 of the page 74 to determine whether the page was successfully programmed. In one embodiment, the control logic 40 may set one or more bits in the status register 58 following the completion of the page read operation (e.g., after the R/B signal reverts to high) to indicate whether the expected count of binary 0's matches the actual count. As will be explained in further detail below, if these values match, the status register 58 may indicate that the page 74 was programmed successfully.

For the purposes of the present discussion, the examples provided herein will illustrate the comparison of an expected count of binary 0 values to an actual count of binary 0 values within a page of a memory array. It should be appreciated, however, that the present technique may also be performed in an opposite manner. That is, alternate embodiments may be implemented by storing an expected count of binary 1 values within the management area of a page, and comparing the expected count of binary 1 values to an actual count of binary 1 values during a page read operation. Additionally, as mentioned briefly above, further embodiments may utilized a reduced count (e.g., modulo count) instead of an actual count (e.g., physical count) of binary values, as will be explained further below.

Further, as will be appreciated, the size of the pages and number of blocks in the NAND flash memory array 46 may vary between implementations. To provide an example, in one presently contemplated embodiment, each page 74 may include a data area 76 having 2048 bytes (2 KB) and a management area 78 having 64 bytes for a total page size of 2112 bytes. The memory array 46 may be constructed such that each block 72 includes 64 pages. Thus, based on these page and block sizes, a 2 gigabyte memory array may include 2048 blocks, a 4 gigabyte memory array may include 4096 blocks, and an 8 gigabyte memory may include 8192 blocks.

Figure 4A:
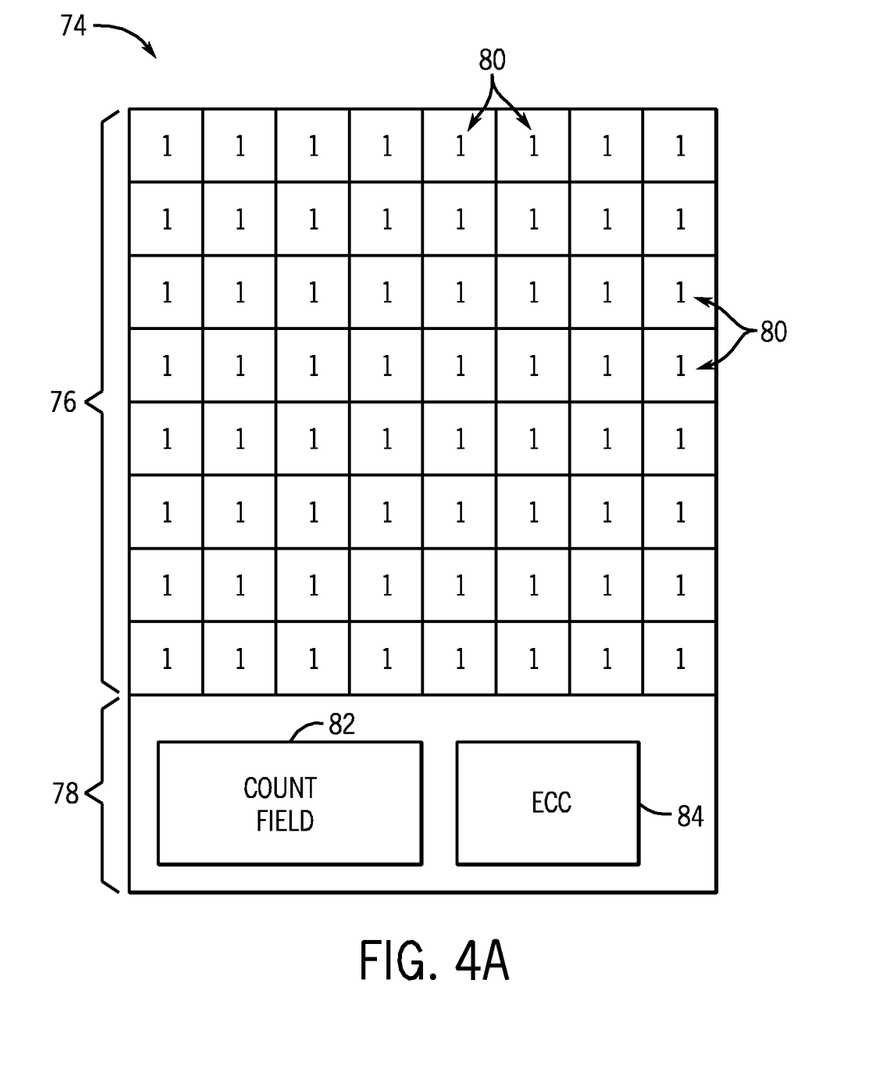
FIGS. 4A-4C are simplified representations illustrating the programming of a page in the memory array of FIG. 3, in accordance with an embodiment of the present invention.
Figure 4B:
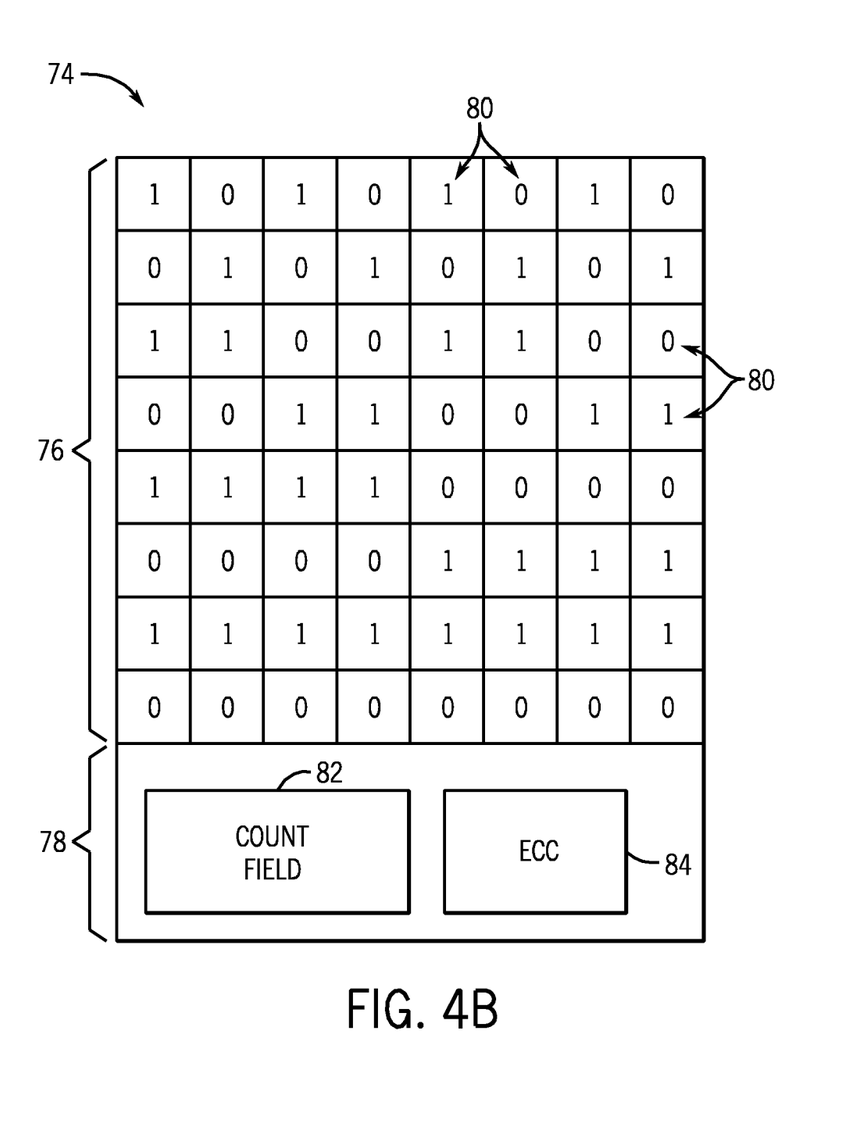
Figure 4C:
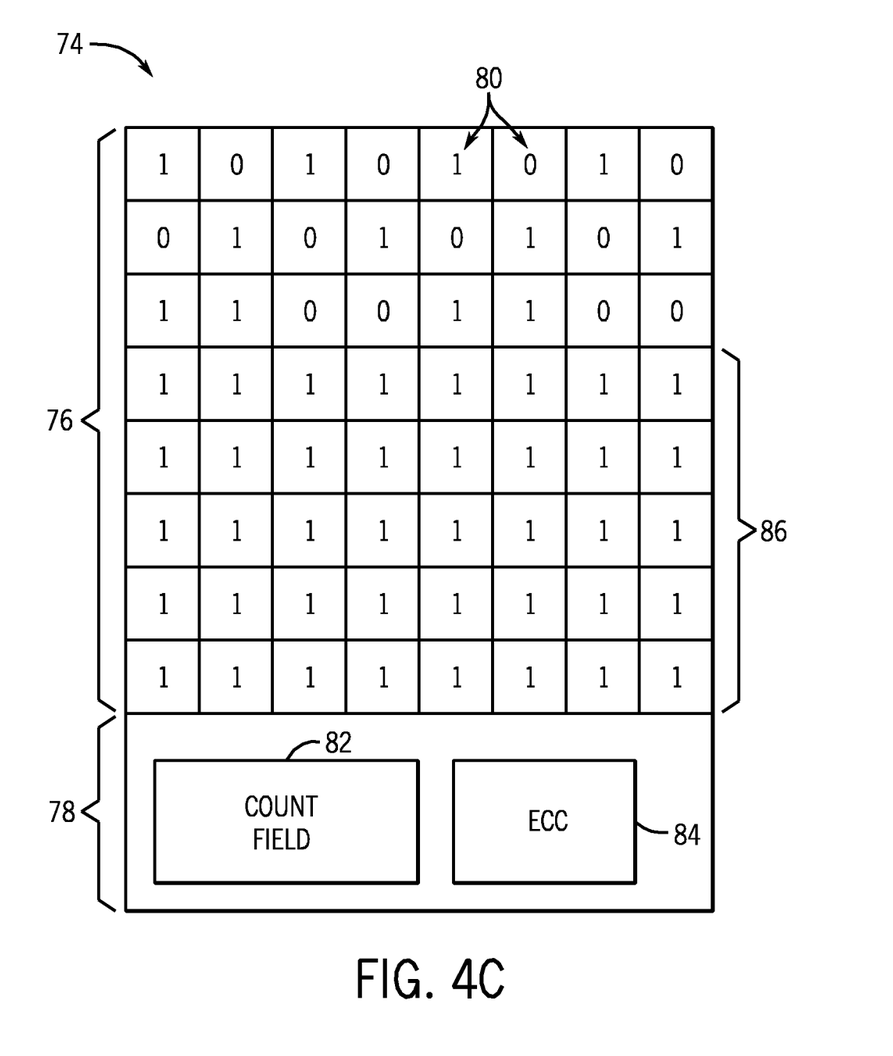

The present techniques may be better understood with reference to FIGS. 4A-4C. These figures provide simplified illustrations with regard to the process of erasing, writing, and reading a page of a NAND flash memory array using the present techniques. Referring first to FIG. 4A, a memory page 74 is illustrated following an erase operation. As mentioned above, in NAND flash memory programming, an erase operation typically begins by writing a binary value of 1 (or "11" in the case of some MLC memory devices, for example) to each memory cell 80 corresponding to a page, which may include writing binary 1 values in the data area 76 and management area 78 of the page 74. As will be understood, the presently illustrated array 74 is depicted as having 64 memory cells merely to provide a simplified illustration of NAND flash memory operations, and should not be interpreted as being drawn to scale. Indeed, as mentioned above, in actual implementations, a memory page may have 2112 bytes (16896 bits), including a 2048 byte data area and a 64 byte management area, for example. Further, in some implementations, a memory page may be subdivided into multiple sectors. For example, a 2048 byte data area may be divided into four 512 byte sectors, and a 64 byte management area may be divided into four 16 byte sectors, each corresponding to a respective one of the 512 byte sectors.

As shown here, the management area 78 of the page 74 may include a count field 82 for storing an expected value of binary 0 data values or, alternatively, binary 1 data values, that are to be written to the data area 76 of the page 74 during a programming operation. As mentioned above, the expected value stored in the count field 82 may correspond to a actual (e.g., physical) count of the data values, or a reduced count (e.g., modulo count). The management area 78 may also store ECC code values which may be used during read back by the ECC logic 42 to detect and/or correct data errors. By way of example, the ECC codes 84 may include linear Hamming codes capable of detecting and correcting single-bit errors within the page 74. Depending on the particular design and implementation, however, more or less robust ECC techniques may be utilized in the memory array 46. Further, where the page read algorithm is performed on a per-sector basis (e.g., sectors of 512 bytes), each sector may have a corresponding ECC field 84 configured to detect and/or correct for data errors within the sector.

FIG. 4B illustrates the memory page 74 following a successful programming operation. During the programming operation, the memory cells corresponding to the data values in the data pattern having a binary value of 0 have changed state. In the illustrated example, the successfully programmed page 74 may include 32 occurrences of a binary value of 0 in the page and 32 occurrences of a binary value of 1 in the page. Thus, during the programming operation, the value written to the count field 82 may reflect that an expected count of 32 binary 0's is to be expected in the data area of the programmed page if the programming operation is completed successfully.

During a page read operation, the programmed data may be read from the page 74. During the read back, the ECC logic 42 may perform in parallel, the detection and/or correction of data errors using the data stored in the ECC field 84 of the page 74. Alternatively, the ECC logic 42 may perform error correction on the page 74 prior to counting the occurrences of binary 0 or 1 values. During this operation, the R/B signal may be asserted low, indicating that the read operation and ECC algorithms are running. Accordingly, any corrections made using the ECC algorithms provided by the ECC logic may be reflected in the final count of binary 0's (or binary 1's). Further, it should be appreciated that in embodiments in which the ECC algorithm is run in parallel while the data values are being read and counted, no substantial additional timing penalties are incurred when compared to conventional NAND flash operations.

Once the R/B signal reverts to a logical high state, the count of the binary 0 values is compared with the expected value stored in the count field 82. If the actual count and expected count values match, then it is determined that the page 74 was programmed successfully, and one or more bits indicating the validity of the programmed data may be set in the status register 58 by the control logic 40.

FIG. 4C illustrates an example in which the programming of the memory page 74 fails to complete successfully. As mentioned above, a number of factors may cause programming failures, including power loss and cell defects. In particular, the present figure illustrates how a loss of power during a programming operation may affect the expected state of the memory cells within the page 74. As mentioned above with regard to FIG. 4A, a write operation begins by writing all binary 1 data values to a page 74 of the NAND flash memory array. During a write operation, the target data pattern is written to the page 74 by altering the state of the memory cells which correspond to the bits within the data pattern having a binary value of 0.

As shown in FIG. 4C, the data pattern written to the page 74 in FIG. 4B is incomplete. This may be caused, for example, by a power failure that occurs during the programming operation. As a result, a portion 86 of the page 74 remains in an erased state (e.g., having binary values of 1). Particularly, it should be noted that the partially programmed page only includes 12 occurrences of a binary value of 0 within the page. Referring back to the example provided in FIG. 4B, the fully programmed data pattern requires 32 occurrences of a binary value of 0 within the page. Accordingly, this programming failure may be detected by the flash management techniques discussed above. For example, following the page read and error correction operations, the actual count of binary 0 data values in the page 74 may indicate only 12 occurrences of a binary value of 0. When compared to the expected count stored in the count field 82 which, as discussed above, may represent a value of 32, the control logic 40 may set one or more appropriate bits in the status register 58 to indicate that the data pattern stored in the page 74 is invalid and should not be used. Thus, the foregoing techniques provide an efficient method for determining the validity of data in a NAND flash memory page using a single write operation to write a data pattern to a page, such that the data pattern includes both the program data and an expected binary 0 or 1 count value. Accordingly, the actual count of the binary 0 or 1 values is compared with the expected count during a page read operation to determine the validity of the program data stored in the page.

Figure 5:
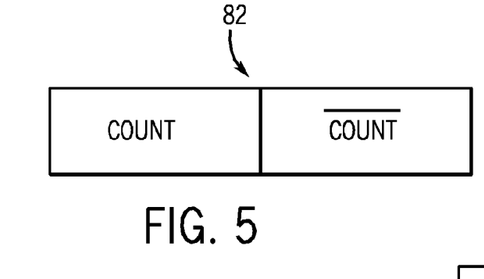
FIG. 5 illustrates a count field that may be implemented in a page of a NAND flash memory array, in accordance with an embodiment of the present invention.

One additional area of concern with regard to the present technique may occur when a programming failure (e.g., due to power loss) prevents the expected count value from being written to the count field 82. Referring now to FIG. 5, one technique for detecting for this additional failure is to program both the expected count value and its bitwise inverse in the count field 82 during the programming of the page 74. Thus, regardless of the count value programmed into the field 82, the read/write logic 44 may be configured to expect a certain number of binary 1 and 0 values within the count field 82. By way of example, if the count value and its bitwise inverse are each represented by 8-bit fields, the read/write logic 44, when performing a page read operation, will expect to read eight binary 1 values and eight binary 0 values in the count field 82. For instance, if the expected count representation is programmed as "00110111," then the inverted expected count may be stored as "11001000." However, if a programming failure occurs and the count field 82 is not fully programmed, then some of the bits within the field may retain their erased state (e.g., binary value of 1). Accordingly, if the read/write logic 44 detects that the count field 82 contains more or less than the expected number of binary 1's or 0's, then the control logic 40 may disregard the count field 82 as containing unreliable or invalid data, and the status register 58 may be set to indicate that the page 74 was not successfully programmed.

In some implementations, particularly where the NAND flash memory management area has only a limited amount of bits in which to store the count field 82 in addition to any other required management data (e.g., ECC fields, wear-leveling data, etc.), it is possible to decrease the size of the count field 82 by storing a modulo count of binary 0 values (or binary 1 values) rather than a true (e.g., physical) count. By way of example, in a page having 2048 bytes of data, the expected count may be determined using a modulus 256 count, thus reducing the total required size of the count field 82. As will be appreciated the techniques set forth in FIG. 5 may also be applied when a modulo expected count is used. Those skilled in the art will further appreciate that an appropriate modulo value (e.g., 256) may be selected based upon the error rate probability of a particular memory device. Further, it should be understood that the expected count value itself may be protected against errors using one or more of the error correction techniques discussed above. In one embodiment, the expected count value may be error-corrected as part of the same error correction operation performed by the ECC logic 42 with regard to the program data stored in the data area of the page 74. In another embodiment, a separate error correction algorithm may be executed by the ECC logic 42 to perform error correction on the expected count value data independently of the program data.

Figure 6A:
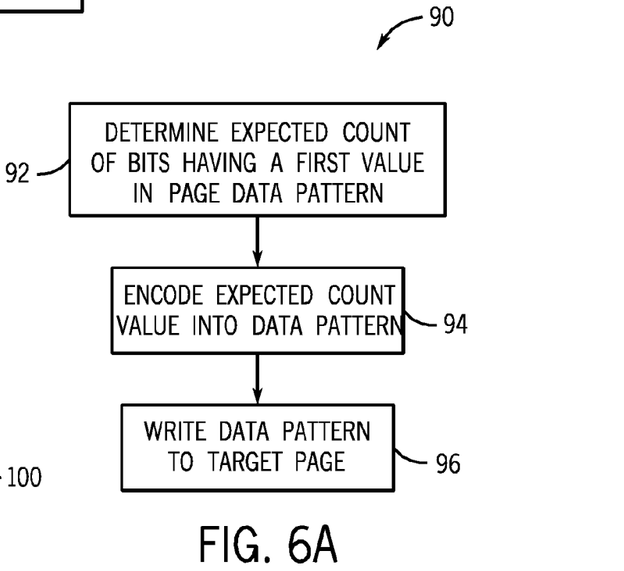
FIG. 6A is a flowchart illustrating a method for programming a page of a NAND flash memory array, in accordance with an embodiment of the present invention.
Figure 6B:
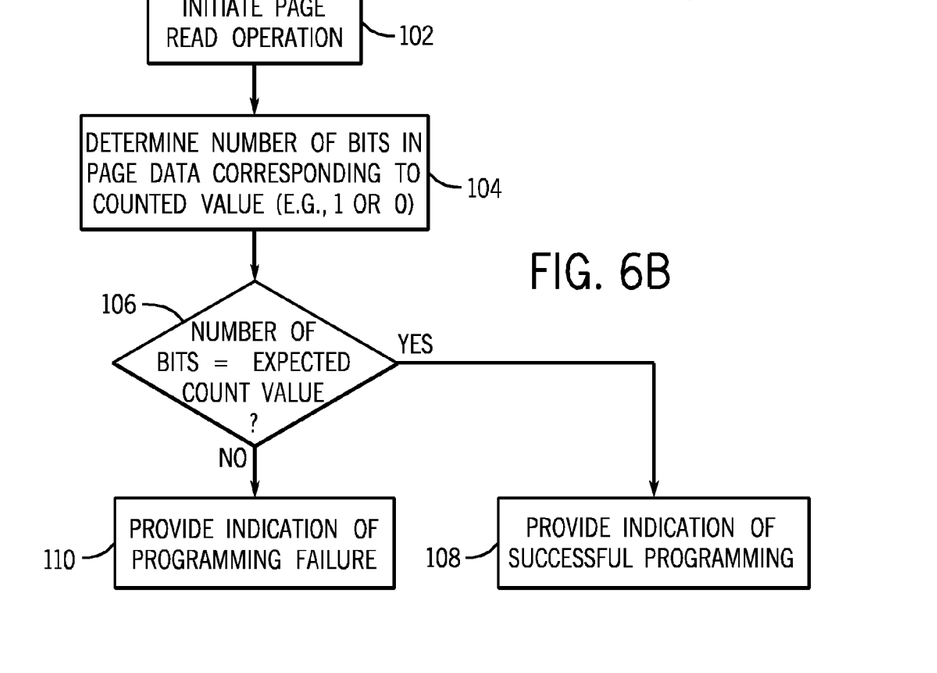
FIG. 6B is a flowchart illustrating a method for reading a page of a NAND flash memory array programmed using the method shown in FIG. 6A, in accordance with an embodiment of the present invention.

Continuing now to FIGS. 6A and 6B, these figures depict flowcharts illustrating methods for writing a data pattern to and reading the data pattern from a memory page in accordance with one or more embodiments of the present invention. Referring first to FIG. 6A, a method 90 for writing a data pattern to a memory page is illustrated. The method 90 begins at step 92, wherein the expected count of a binary value (e.g., 0) that is to be written into the data area of the memory page is determined. For instance, referring to the example illustrated in FIG. 4B, the step 92 may determine that 32 binary 0 values are expected to be written to the data area 76 of the page 74. Next, at step 94, the expected count value is encoded into the data pattern that is to be written to the page. For example, the expected count value may be encoded into the data pattern such that the expected count value will ultimately be written to the count field 82 when the data pattern is written to the target page. As discussed above, the expected count value may be encoded along with its bitwise inverse, and may also be a modulo count instead of a true physical count, such as in implementations where the size of the count field 82 is limited. Finally, at step 96, the data pattern having the expected count value encoded therein is written to the target page, such as when a programming operation is initiated on the memory device. In particular, it should be noted that the data pattern and the expected count value can be written to the page in the same access operation.

Continuing to FIG. 6B, a method 100 for reading and verifying the validity of the data written to the target page in FIG. 6A is illustrated. The method 100 begins at step 102 in which a page read operation is initiated by the memory device 30. For example, with reference to FIG. 2, a page read operation may be initiated by sending an appropriate command code on the command bus 36 and by setting the R/E# (read enable) control signal. In one implementation, the selected page may be read by outputting the data serially from the memory array 46 into a data register 64.

As discussed above, during the page read operation, the number of binary 0 values (or binary 1 values) within the page are counted, as shown at step 104. As explained above, in some embodiments, the page read operation may operate in parallel with an ECC algorithm configured to detect and/or correct data errors. Thereafter, at step 106, the counted number of binary 0 values is compared to the expected count of binary 0 values, which may be stored in the count field 82 in the management area 78 of the target page 74. If it is determined that the actual count matches the expected count value, than the method 100 continues to step 108, in which an indication that the page was successfully programmed is provided. By way of example, the control logic 40 of the NAND flash memory device 30 may set one or more bits within the status register 58 to indicate the validity of the data within the page. Returning to step 106, if the actual count does not match the expected count value, then the method 100 may continue to step 110, wherein an indication that the page was not successfully programmed is provided, such as by setting the appropriate bit or bits in the status register 58. Thus, based on the results written to the status register 58 following the page read operation, the processor 12 may be able to determine whether the data read from the target page is valid.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method comprising:
   determining, using control logic circuitry in the a memory device, an expected count value corresponding to a number of occurrences of a particular data value in data that is to be programmed in a data area in a memory array of the memory device;
   encoding, using the control logic circuitry, the expected count value into a data pattern such that the data pattern comprises the data and the expected count value; and
   programming, using the control logic circuitry, the data pattern in the memory array.

2. The method of claim 1, wherein the data pattern is programmed in the memory array in a single operation.

3. The method of claim 1, wherein programming the data pattern comprises first erasing each memory cell in the memory array.

4. The method of claim 3, wherein erasing each memory cell comprises programming a binary value of 1 in each memory cell.

5. The method of claim 1, wherein programming the data pattern in the memory array comprises programming the data pattern in a data area of a page of the memory array.

6. The method of claim 5, wherein programming the data pattern in the page of the memory array comprises programming the data in the data area of the page and programming the expected count value in a management area of the page.

7. The method of claim 6, wherein programming the expected count value comprises programming the expected count value and the bitwise inverse of the expected count value in a count field.

8. The method of claim 1, wherein determining the expected count value comprises determining a modulo count value.

9. A method comprising:
   programming, using control logic circuitry in a memory device, an expected count value and data in a page of a memory array of the memory device in a single operation;
   reading, using the control logic circuitry, the data programming in the page, wherein an actual count of a number of occurrences of a particular data value in the page is determined; and
   comparing, using the control logic circuitry, the actual count to the expected count value.

10. The method of claim 9, comprising:
    providing a first indication that the data in the page is valid if the actual count and the expected count match; and
    providing a second indication that the data in the page is invalid if the actual count and the expected count do not match.

11. The method of claim 10, wherein the first or second indications are provided by setting one or more bits in a status register of the memory device.

12. The method of claim 9, wherein the expected count value is read from a count field in a management area of the page.

13. The method of claim 12, wherein the count field is configured to store the expected count value and the bitwise inverse of the expected count value.

14. The method of claim 13, comprising providing an indication that the data in the page is invalid if the number of bits in the count field having the particular data value is not equal to half the total number of bits in the count field.

15. The method of claim 12, wherein the management area is further configured to store error correction code.

16. The method of claim 15, comprising performing error correction on the page using the error correction code prior to comparing the actual count to the expected count value, if an error is detected.

17. The method of claim 15, wherein the error correction code comprises a Hamming code.

18. A method comprising:
    determining, using control logic circuitry in a memory device, an actual count of a number of occurrences of a particular data value in data stored in a page of a memory array of the memory device;
    determining, using the control logic circuitry, if an expected count value is valid; and
    if the expected count value is valid, comparing, using the control logic circuitry, the actual count to an expected count value.

19. The method of claim 18, wherein determining if an expected count value is valid comprises:
    reading the expected count value and its bitwise inverse from a count field in the page;
    determining the total number of occurrences of either the particular data value or the complement of the particular data value; and
    indicating that the expected count value is valid if the determined total number of occurrences read from the count field is equal to half the total number of bits required to store the expected count value and its bitwise inverse, or else indicating that the expected count value is invalid.

20. The method of claim 18, comprising indicating that the data is invalid if the actual count and expected count values do not match.

21. The method of claim 18, wherein the page comprises multiple sectors, and wherein determining an actual count of the particular data value comprises counting the occurrences of the particular data value in each sector.

22. The method of claim 18, comprising performing error correction prior to comparing the actual and expected count values.

23. A method for comprising:

providing a memory array of a memory device comprising a plurality of memory pages; and providing control logic circuitry configured to execute a page read operation to read data stored in a memory page of the plurality of memory pages to determine the validity of the data by comparing an actual count of a number of occurrences of a particular data value in the data to an expected count value.

24. The method of claim 23, wherein the control logic circuitry is configured to provide a first indication that the data is valid if the actual count and the expected count match and to provide a second indication that the data is invalid if the actual count and the expected count do not match.

25. The method of claim 24, comprising providing a status register coupled to the control logic circuitry, wherein the first or second indication is provided by setting one or more bits within the status register.

26. The method of claim 23, wherein each of the pages comprises a management area.

27. The method of claim 26, wherein the management area comprises a count field configured to store the expected count value.

28. The method of claim 26, wherein the management area is configured to store error correction code.

29. The method of claim 28, comprising performing error correction on the page using the error correction code prior to comparing the actual count to the expected count value, if an error is detected.

30. The method of claim 28, wherein the error correction code comprises a Hamming code.

31. The method of claim 23, wherein the data and the expected count value are programmed in the page in a single operation.

32. The method of claim 23, wherein the memory device comprises a NAND flash memory device.

* * * * *

UNITED STATES PATENT AND TRADEMARK OFFICE
CERTIFICATE OF CORRECTION

PATENT NO. : 8,468,400 B2  
APPLICATION NO. : 13/589861  
DATED : June 18, 2013  
INVENTOR(S) : Feeley et al.

Page 1 of 1

It is certified that error appears in the above-identified patent and that said Letters Patent is hereby corrected as shown below:

In the Claims

In column 11, line 39, in Claim 1, delete "in the a" and insert -- in a --, therefor.

In column 13, line 9, in Claim 23, after "method" delete "for".

Signed and Sealed this
Tenth Day of September, 2013

Teresa Stanek Rea
*Acting Director of the United States Patent and Trademark Office*